United States Patent
Hosokawa et al.

(10) Patent No.: US 9,153,576 B2
(45) Date of Patent: Oct. 6, 2015

(54) SEMICONDUCTOR DEVICE

(71) Applicants: Hiroshi Hosokawa, Toyota (JP); Yusuke Yamashita, Nagoya (JP); Satoru Machida, Nagakute (JP)

(72) Inventors: Hiroshi Hosokawa, Toyota (JP); Yusuke Yamashita, Nagoya (JP); Satoru Machida, Nagakute (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 14/584,793

(22) Filed: Dec. 29, 2014

(65) Prior Publication Data

US 2015/0214217 A1 Jul. 30, 2015

(30) Foreign Application Priority Data

Jan. 27, 2014 (JP) .................................. 2014-012505

(51) Int. Cl.
H01L 27/06 (2006.01)
H01L 29/739 (2006.01)

(52) U.S. Cl.
CPC ........ H01L 27/0664 (2013.01); H01L 29/7395 (2013.01)

(58) Field of Classification Search
CPC ............ H01L 27/0664; H01L 27/0652; H01L 29/7395; H01L 29/7802; H01L 29/7393; H01L 2924/13055; H01L 29/66712; H01L 29/66734

See application file for complete search history.

(56) References Cited

U.S. PATENT DOCUMENTS

2008/0191307 A1* 8/2008 Darwish ....................... 257/493
2013/0240947 A1* 9/2013 Matsudai et al. ............. 257/139

FOREIGN PATENT DOCUMENTS

JP  2009-253004 A  10/2009
JP  2013-008778 A  1/2013

* cited by examiner

Primary Examiner — Jose R Diaz
(74) Attorney, Agent, or Firm — Oliff PLC

(57) ABSTRACT

A semiconductor substrate comprises an IGBT region and a diode region. The IGBT region comprises: an n-type emitter region; a p-type IGBT body region; an n-type IGBT barrier region; an n-type IGBT drift region; a p-type collector region; a first trench; a first insulating layer; and a first gate electrode. The diode region comprises: a p-type diode top body region; an n-type diode barrier region; a p-type diode bottom body region; an n-type cathode region; a second trench; a second insulating layer; and a second gate electrode. An n-type impurity density of a specific part of the diode barrier region making contact with the second insulating layer is higher than an n-type impurity density of the IGBT barrier region.

4 Claims, 2 Drawing Sheets

SEMICONDUCTOR DEVICE

CROSS-REFERENCE TO RELATED APPLICATION

This application claims priority to Japanese Patent Application No. 2014-012505 filed on Jan. 27, 2014, the contents of which are hereby incorporated by reference into the present application.

TECHNICAL FIELD

The technique disclosed in the present application relates to a semiconductor device.

DESCRIPTION OF RELATED ART

Japanese Patent Application Publication No. 2009-253004 discloses a semiconductor device including a semiconductor substrate, wherein the semiconductor substrate comprises an IGBT region and a diode region. An n-type drift region and a p-type body region formed across the IGBT region and the diode region, are formed in the IGBT region and diode region. An n-type barrier region formed across the IGBT region and the diode region, is formed in the body region. Furthermore, a plurality of trenches that penetrates the semiconductor substrate and reaches the drift region, an insulating layer covering an inner surface of each trench, and a gate electrode contained in the trench in a state where the gate electrode is covered by the insulating layer, are formed in the IGBT region and diode region.

SUMMARY

The semiconductor device as described above (i.e., a diode integrated IGBT) employs a method of constantly applying a negative voltage (i.e., negative bias) to the gate electrode while the IGBT region is off in order to prevent a phenomenon of the IGBT region turning on inadvertently (so-called self-turn-on). By applying the negative voltage to the gate electrode, a p-type channel is formed in a range making contact with the insulating layer of the barrier region of the diode region. If the diode region is turned on, holes flow in the following order: a body region at a top side of the barrier region (called top body region below), a channel, a body region at a bottom side of the barrier region (called bottom body region below), and a drift region. In this case, if the amount of holes flowing through the channel into the drift region becomes excessive, diode recovery characteristics may deteriorate.

The present specification discloses a semiconductor device which can suppress deterioration of diode recovery characteristics when a negative voltage is applied to the gate electrode.

This description discloses a semiconductor device comprising a semiconductor substrate. The semiconductor substrate comprises an IGBT region and a diode region. The IGBT region comprises: an n-type emitter region exposed at a part of a front surface of the semiconductor substrate; a p-type IGBT body region formed at a deeper position than the emitter region; an n-type IGBT barrier region formed at a deeper position than the IGBT body region; an n-type IGBT drift region formed at a deeper position than the IGBT barrier region, having an n-type impurity density lower than that in the IGBT barrier region; a p-type collector region formed at a deeper position than the IGBT drift region, wherein the collector region is exposed at a rear surface of the semiconductor substrate; a first trench penetrating the emitter region, the IGBT body region and the IGBT barrier region, wherein a bottom part of the first trench projects into the IGBT drift region; a first insulating layer covering an inner surface of the first trench; and a first gate electrode contained in the first trench in a state where the first gate electrode is covered by the first insulating layer. The diode region comprises: a p-type diode top body region exposed at the front surface of the semiconductor substrate; an n-type diode barrier region formed at a deeper position than the diode top body region; a p-type diode bottom body region formed at a deeper position than the diode barrier region; an n-type cathode region formed at a deeper position than the diode bottom body region, wherein the cathode region is exposed at the rear surface of the semiconductor substrate; a second trench penetrating the diode top body region, the diode barrier region and the diode bottom body region, wherein a bottom part of the second trench projects into the cathode region; a second insulating layer covering an inner surface of the second trench; and a second gate electrode contained in the second trench in a state where the second gate electrode is covered by the second insulating layer. An n-type impurity density of a specific part of the diode barrier region making contact with the second insulating layer is higher than an n-type impurity density of the IGBT barrier region.

In the semiconductor device described above, the IGBT region may have a p-type semiconductor region (i.e., IGBT bottom body region) between the IGBT barrier region and the IGBT drift region. Further, the specific part of the diode barrier region means the part that makes contact with the second insulating layer.

In the semiconductor device described above, a negative voltage is applied to the second gate electrode in order to prevent self-turn-on of the IGBT region. By applying the negative voltage to the second gate electrode, a p-type channel is formed in the specific part of the diode barrier region making contact with the second insulating layer. The width of the channel formed in the diode barrier region is inversely proportional to the n-type impurity density of the specific part. In the semiconductor device described above, the n-type impurity density of the specific part of the diode barrier region making contact with the second insulating layer is higher than the n-type impurity density of the IGBT bather region. Here, the term "impurity density" includes an average impurity density in that region. Consequently, the width of the channel formed in the specific part in the case of negative voltage being applied to the second gate electrode is narrower than the width of the channel formed in the IGBT barrier region in the case of negative voltage being applied to the first gate electrode. Therefore, when the diode region is turned on, the amount of holes flowing through the channel from the body region toward the cathode region can be reduced. As a result, it is possible to prevent the amount of holes flowing through the channel into the cathode region from becoming excessive. Thus, according to the semiconductor device described above, the deterioration of the diode recovery characteristics can be prevented.

The n-type impurity density of the specific part may be higher than an n-type impurity density of a part other than the specific part of the diode barrier region.

It is not preferred that, when the diode region is turned on, the amount of holes flowing into the drift region becomes too small, and thus an on-resistance of the diode region increases. According to the configuration described above, the n-type impurity density of the part other than the specific part of the diode barrier region is lower than the n-type impurity density of the specific part. Therefore, a portion of the holes can flow through the part other than the specific part of the diode barrier region from the body region into the cathode region. Thus, it is possible to prevent the on-resistance from becoming too high.

Another semiconductor device disclosed in the present specification is a semiconductor device in which an IGBT region and a diode region are formed in the same semiconductor substrate. Basic structures of the IGBT region and the diode region are the same as above. Namely, the IGBT region comprises: an n-type emitter region; a p-type IGBT body region; an n-type IGBT barrier region; an n-type IGBT drift region; a p-type collector region; a first trench; a first insulating layer; and a first gate electrode. The diode region comprises: a p-type diode top body region; an n-type diode bather region; a p-type diode bottom body region; an n-type cathode region; a second trench; a second insulating layer; and a second gate electrode. This semiconductor device is characterized in that the second insulating layer is thicker than the first insulating layer. Moreover, in this semiconductor device also, the IGBT region may have a p-type semiconductor region (i.e., IGBT bottom body region) between the IGBT barrier region and the IGBT drift region.

In the semiconductor device described above, the second insulating layer is thicker than the first insulating layer. Therefore, the width of the channel formed in a part of the diode barrier region making contact with the second insulating layer in the case of negative voltage being applied to the second gate electrode is narrower than the width of the channel formed in the IGBT barrier region in the case of negative voltage being applied to the first gate electrode. Therefore, when the diode region is turned on, the amount of holes flowing through the channel from the body region toward the cathode region can be reduced. It is possible to prevent the amount of holes flowing through the channel into the cathode region from becoming excessive. Thus, according to the semiconductor device described above, it is possible to prevent the deterioration of the diode recovery characteristics.

Another semiconductor device disclosed in the present specification is a semiconductor device in which an IGBT region and a diode region are formed in the same semiconductor substrate. Basic structures of the IGBT region and the diode region are the same as above. Namely, the IGBT region comprises: an n-type emitter region; a p-type IGBT body region; an n-type IGBT barrier region; an n-type IGBT drift region; a p-type collector region; a first trench; a first insulating layer; and a first gate electrode. The diode region comprises: a p-type diode top body region; an n-type diode barrier region; a p-type diode bottom body region; an n-type cathode region; a second trench; a second insulating layer; and a second gate electrode. This semiconductor device is characterized in that the resistance of the channel formed in the diode barrier region is greater than the resistance of the channel formed in the IGBT barrier region. Moreover, in this semiconductor device also, the IGBT region may have a p-type semiconductor region (i.e., IGBT bottom body region) between the IGBT barrier region and the IGBT drift region.

In the semiconductor device described above, the resistance of the channel formed in the diode barrier region is greater than the resistance of the channel formed in the IGBT barrier region. Therefore, when the diode region is turned on, the amount of holes flowing through the channel from the body region toward the cathode region can be reduced. It is possible to prevent the amount of holes flowing through the channel into the cathode region from becoming excessive. Thus, according to the semiconductor device described above, it is possible to prevent the deterioration of the diode recovery characteristics.

DETAILED DESCRIPTION

Figure 1:
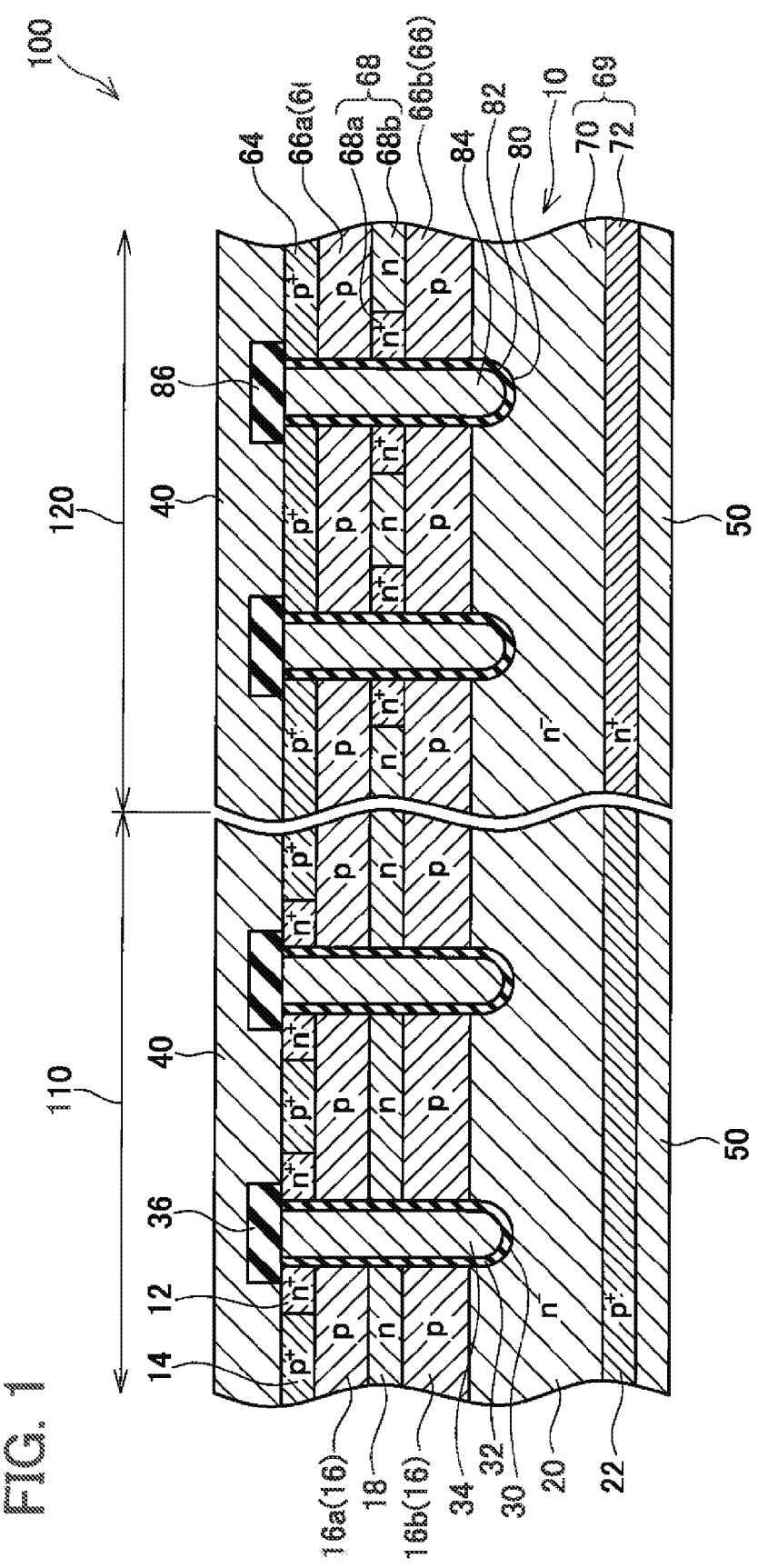
FIG. 1 shows a cross-sectional view of a semiconductor device of a first embodiment.

First Embodiment
(Structure of Semiconductor Device 100)
As shown in FIG. 1, a semiconductor device 100 of the present embodiment has a semiconductor substrate 10 predominately composed of Si. The semiconductor device 100 is an RC-IGBT in which the semiconductor substrate 10 comprises an IGBT region 110 and a diode region 120. Interlayer insulating layers 36, 86 and a front surface electrode 40 are formed on a front surface of the semiconductor substrate 10, and a rear surface electrode 50 is formed on rear surface of the semiconductor substrate 10.

In the IGBT region 110, an emitter region 12, a contact region 14, an IGBT top body region 16a, an IGBT barrier region 18, an IGBT bottom body region 16b, an IGBT drift region 20, a collector region 22, a first trench 30, a first insulating layer 32, and a first gate electrode 34 are formed. Below, the IGBT top body region 16a and the IGBT bottom body region 16b combined may be referred to as "IGBT body region 16".

The emitter region 12 is an n-type semiconductor region. The emitter region 12 is formed in a range exposed at the front surface of the semiconductor substrate 10. The emitter region 12 is formed in a range making contact with the first insulating layer 32 in the first trench 30. The n-type impurity density of the emitter region 12 is higher than the n-type impurity density of the IGBT drift region 20. Here, the term "impurity density" means an average impurity density in that region. A front surface of the emitter region 12 is in ohmic connection with the front surface electrode 40.

The contact region 14 is a p-type semiconductor region. The contact region 14 is formed in a range exposed at the front surface of the semiconductor substrate 10. The p-type impurity density of the contact region 14 is higher than the p-type impurity density of the IGBT body region 16. A front surface of the contact region 14 is in ohmic connection with the front surface electrode 40.

The IGBT top body region 16a is a p-type semiconductor region. The IGBT top body region 16a is formed at a position deeper than the emitter region 12 and the contact region 14. The IGBT top body region 16a makes contact with the first insulating layer 32 in the first trench 30. The p-type impurity density of the IGBT top body region 16a is lower than the p-type impurity density of the contact region 14.

The IGBT barrier region 18 is an n-type semiconductor region. The IGBT barrier region 18 is formed in the IGBT body region 16 (i.e., between the IGBT top body region 16a and the IGBT bottom body region 16b). The IGBT barrier region 18 is separated from the emitter region 12 and the contact region 14 by the IGBT top body region 16a. The IGBT barrier region 18 makes contact with the first insulating layer 32 in the first trench 30. In the present embodiment, the n-type impurity density of the IGBT barrier region 18 is equal to or more than $1 \times 10^{15}$ atoms/cm$^3$ and equal to or less than $1 \times 10^{19}$ atoms/cm$^3$. Further, the thickness (i.e., length in the vertical direction of FIG. 1) of the IGBT barrier region 18 is equal to or more than 0.5 μm and equal to or less than 3.0 μm.

The IGBT bottom body region 16b is a p-type semiconductor region. The IGBT bottom body region 16b is formed at a deeper position than the IGBT barrier region 18. The IGBT bottom body region 16b is separated from the IGBT top body region 16a by the IGBT barrier region 18. The IGBT bottom body region 16b makes contact with the first insulating layer 32 in the first trench 30. In the present embodiment, the p-type impurity density of the IGBT bottom body region 16b is the same as the p-type impurity density of the IGBT top body region 16a.

The IGBT drift region 20 is an n-type semiconductor region. The IGBT drift region 20 is formed at a position deeper than the IGBT bottom body region 16b. The IGBT drift region 20 is separated from the IGBT barrier region 18 by the IGBT bottom body region 16b. The n-type impurity density of the IGBT drift region 20 is lower than the n-type impurity density of the IGBT barrier region 18. In the present embodiment, the n-type impurity density of the IGBT drift region 20 is equal to or more than $1 \times 10^{12}$ atoms/cm$^3$ and equal to or less than $1 \times 10^{15}$ atoms/cm$^3$.

The collector region 22 is a p-type semiconductor region. The collector region 22 is formed at a position deeper than the IGBT drift region 20. The collector region 22 is formed in a range exposed at a rear surface of the semiconductor substrate 10. The p-type impurity density of the collector region 22 is higher than the p-type impurity density of the IGBT body region 16. The rear surface of the collector region 22 is in ohmic connection with the rear surface electrode 50.

In the front surface of the semiconductor substrate 10 in the IGBT region 110, a plurality of the first trenches 30 is formed. Each first trench 30 is formed so as to penetrate from the front surface of the semiconductor substrate 10 through the emitter region 12, the IGBT top body region 16a, the IGBT barrier region 18, and the IGBT bottom body region 16b. A bottom part of each first trench 30 projects into the IGBT drift region 20. The first gate electrode 34 covered by the first insulating layer 32 is provided inside the first trench 30. In the present embodiment, the thickness of the first insulating layer 32 is equal to or more than 50 nm and equal to or less than 200 nm. An upper surface of each first gate electrode 34 is covered by the interlayer insulating layer 36, and is electrically insulated from the front surface electrode 40. However, each first gate electrode 34 is electrically connectable to outside at a position which is not shown.

In the diode region 120, an anode region 64, a diode top body region 66a, a diode barrier region 68, a diode bottom body region 66b, a cathode region 69, a second trench 80, a second insulating layer 82, and a second gate electrode 84 are formed. Below, the diode top body region 66a and the diode bottom body region 66b together may be termed "diode body region 66".

The anode region 64 is a p-type semiconductor region. The anode region 64 is formed in a range exposed at the front surface of the semiconductor substrate 10. The anode region 64 makes contact with the second insulating layer 82 in the second trench 80. The p-type impurity density of the anode region 64 is higher than the p-type impurity density of the diode body region 66.

The diode top body region 66a is a p-type semiconductor region. The diode top body region 66a is formed at a position deeper than the anode region 64, and is formed adjacent to the anode region 64. In the present embodiment, the diode top body region 66a is formed so as to be continuous with the IGBT top body region 16a in the IGBT region 110. The p-type impurity density of the diode top body region 66a is lower than the p-type impurity density of the anode region 64.

The diode barrier region 68 is an n-type semiconductor region. The diode barrier region 68 is formed in the diode body region 66 (i.e., between the diode top body region 66a and the diode bottom body region 66b). In the present embodiment, the diode barrier region 68 is formed so as to be continuous with the IGBT bather region 18 in the IGBT region 110. The diode barrier region 68 is separated from the anode region 64 by the diode top body region 66a.

The diode barrier region 68 has two parts: a first part 68a and a second part 68b. The first part 68a is a part making contact with the second insulating layer 82 in the second trench 80. The second part 68b is a part other than the first part 68a in the diode barrier region 68, and is a part formed between two of the first parts 68a. The n-type impurity density of the first part 68a is higher than the n-type impurity density of the IGBT barrier region 18 in the IGBT region 110. Further, the n-type impurity density of the first part 68a is higher than the n-type impurity density of the second part 68b. In the present embodiment, the n-type impurity density of the second part 68b is the same as the n-type impurity density of the IGBT barrier region 18. In the present embodiment, the n-type impurity density of the first part 68a is equal to or more than $1 \times 10^{18}$ atoms/cm$^3$ and equal to or less than $1 \times 10^{21}$ atoms/cm$^3$. Further, the n-type impurity density of the second part 68b is equal to or more than $1 \times 10^{15}$ atoms/cm$^3$ and equal to or less than $1 \times 10^{18}$ atoms/cm$^3$. Further, the thickness (i.e., length in the vertical direction of FIG. 1) of the diode barrier region 68 is equal to or more than 0.5 μm and equal to or less than 3.0 μm. Further, in the present embodiment, the width (i.e., length in the horizontal direction of FIG. 1) of the first part 68a is equal to or more than 0.5 μm and equal to or less than 3.0 μm.

The diode bottom body region 66b is a p-type semiconductor region. The diode bottom body region 66b is formed at a position deeper than the diode bather region 68. The diode bottom body region 66b is separated from the diode top body region 66a by the diode bather region 68. The diode bottom body region 66b makes contact with the second insulating layer 82 in the second trench 80. In the present embodiment, the p-type impurity density of the diode bottom body region 66b is the same as the p-type impurity density of the diode top body region 66a.

The cathode region 69 is an n-type semiconductor region. The cathode region 69 has a diode drift region 70 and a cathode contact region 72. The diode drift region 70 is formed at a position deeper than the diode bottom body region 66b. The diode drift region 70 is separated from the diode barrier region 68 by the diode bottom body region 66b. In the present embodiment, the diode drift region 70 is formed so as to be continuous with the IGBT drift region 20 in the IGBT region 110. The n-type impurity density of the diode drift region 70 is lower than the n-type impurity density of the diode barrier region 68. In the present embodiment, the n-type impurity density of the diode drift region 70 is equal to or more than $1 \times 10^{12}$ atoms/cm$^3$ and equal to or less than $1 \times 10^{15}$ atoms/cm$^3$.

The cathode contact region 72 is an n-type semiconductor region. The cathode contact region 72 is formed at a position deeper than the diode drift region 70. Further, the cathode contact region 72 is formed in a range exposed at the rear surface of the semiconductor substrate 10. The n-type impurity density of the cathode contact region 72 is higher than the n-type impurity density of the diode drift region 70. A rear surface of the cathode contact region 72 is in ohmic connection with the rear surface electrode 50.

In the front surface of the semiconductor substrate 10 in the diode region 120, a plurality of the second trenches 80 is formed. Each second trench 80 is formed so as to penetrate from the front surface of the semiconductor substrate 10 through the anode region 64, the diode top body region 66a, the diode barrier region 68, and the diode bottom body region 66b. A bottom part of each second trench 80 projects into the diode drift region 70. The second gate electrode 84 covered by the second insulating layer is provided inside the second trench 80. In the present embodiment, the thickness of the first insulating layer 32 is equal to or more than 50 nm and equal to or less than 200 nm. An upper surface of each second gate electrode 84 is covered by the interlayer insulating layer 86, and is electrically insulated from the front surface electrode 40. However, each second gate electrode 84 is electrically connectable to outside at a position which is not shown.

(Operation of Semiconductor Device 100)

Next, operation of the semiconductor device 100 of the present embodiment will be described. First, a case where the IGBT region 110 is operating will be described. The IGBT is turned on when voltage (i.e., forward voltage relative to the IGBT region 110 (reverse voltage relative to the diode region 120)) to make the rear surface electrode 50 plus is applied between the front surface electrode 40 and the rear surface electrode 50, and positive voltage of a predetermined magnitude is applied to the first gate electrode 34 and the second gate electrode 84 (positive potential to the emitter potential: called 'IGBT ON voltage' hereinbelow). In the present embodiment, the IGBT ON voltage applied to the first gate electrode 34 and the second gate electrode 84 is 1V to 10V. By applying the IGBT ON voltage to the first gate electrode 34, an n-type channel is formed, in the IGBT body region 16 (i.e., the IGBT top body region 16a and the IGBT bottom body region 16b) in the range making contact with the first insulating layer 32, in the IGBT region 110. Then, electrons flow from the front surface electrode 40 to the rear surface electrode 50 via the emitter region 12, the channel, the IGBT drift region 20, and the collector region 22. Further, a portion of holes injected from the rear surface electrode 50 flows to the front surface electrode 40 via the collector region 22, the IGBT drift region 20, the IGBT bottom body region 16b, the IGBT barrier region 18, the IGBT top body region 16a, and the contact region 14. Thereby, current flows from the rear surface electrode 50 to the front surface electrode 40. Moreover, as described above, the IGBT ON voltage is also applied to the second gate electrode 84 in the diode region 120 simultaneously with the IGBT ON voltage being applied to the first gate electrode 34 in the IGBT region 110. Thereby, an n-type channel is also formed in the diode body region 66 in the range making contact with the second insulating layer 82, but the diode is not turned on.

Next, a case where the diode region 120 is operating will be described. The diode is turned on when voltage (i.e., forward voltage to the diode region 120 (reverse voltage to the IGBT region 110)) to make the front surface electrode 40 plus is applied between the front surface electrode 40 and the rear surface electrode 50. During operation, the diode region 120 has a mode in which negative voltage (negative bias) is applied to the second gate electrode 84 and the first gate electrode 34 in order to prevent self-turn-on of the IGBT region 110. At this juncture, a p-type channel is formed in the diode barrier region 68 (i.e., the first part 68a) in the range making contact with the second insulating layer 82, in the diode region 120. Then, electrons flow from the rear surface electrode 50 to the front surface electrode 40 via the cathode contact region 72, the diode drift region 70, the diode bottom body region 66b, the channel, the diode top body region 66a, and the anode region 64. Further, holes flow from the front surface electrode 40 to the rear surface electrode 50 via the anode region 64, the diode top body region 66a, the diode barrier region 68, the diode bottom body region 66b, the diode drift region 70, and the cathode contact region 72. Further, a portion of the holes flows toward the rear surface electrode 50 not through the diode barrier region 68, but through the channel. Thereby, current flows from the front surface electrode 40 to the rear surface electrode 50. Moreover, as described above, diode ON voltage is also applied to the first gate electrode 34 in the IGBT region 110 simultaneously with the diode ON voltage being applied to the second gate electrode 84 in the diode region 120. Thereby, a p-type channel is also formed in the IGBT barrier region 18 in the range making contact with the first insulating layer 32, but the IGBT is not turned on.

In the semiconductor device 100 of the present embodiment, the n-type impurity density of the first part 68a of the diode barrier region 68 is higher than the n-type impurity density of the IGBT barrier region 18 and the second part 68b. Thus, in the case where the diode is turned on, the width of the p-type channel formed in the first part 68a is narrower than the width of the p-type channel formed in the IGBT barrier region 18. Consequently, the resistance of the p-type channel formed in the first part 68a of the diode barrier region 68 is greater than the resistance of the p-type channel formed in the IGBT barrier region 18. Thus, since the resistance of the channel formed in the first part 68a is great, the amount of holes flowing through the channel toward the diode drift region 70 can be reduced when the diode region is turned on. Thus, it is possible to prevent the amount of holes flowing into the diode drift region 70 from becoming excessive.

On the other hand, it is not preferred that, when the diode is turned on, the amount of holes flowing into the diode drift region 70 becomes too small such that the on-resistance of the diode increases. In the semiconductor device 100 of the present embodiment, the n-type impurity density of the second part 68b of the diode barrier region 68 is lower than the n-type impurity density of the first part 68a. Therefore, a portion of the holes flows through the second part 68b of the diode barrier region 68 into the diode drift region 70. Thus, it is also possible to prevent the on-resistance of the diode from becoming too high.

When the voltage applied to the diode is switched from forward voltage to reverse voltage, the diode performs a reverse recovery operation. That is, the holes that were present in the diode drift region 70 when forward voltage was applied, are discharged to the front surface electrode 40. Thereby, a reverse current flows through the diode for a short period. The reverse current decays in a short time, and then the current flowing through the diode becomes substantially zero. In the semiconductor device of the present embodiment, as described above, the amount of holes flowing into the diode drift region 70 while the diode is on is prevented from becoming excessive. Therefore, the amount of holes discharged to the front surface electrode 40 during the reverse recovery operation is also not excessively great. Consequently, in this semiconductor device, the reverse current flowing into the diode during the reverse recovery operation is not too high.

As described above, in the semiconductor device 100 of the present embodiment, by having the n-type impurity density of the first part 68a be high, a large amount of holes are prevented from flowing through the channel into the diode drift region 70 while the diode is on. Thereby, the recovery characteristics of the diode are improved. Further, by having the n-type impurity density of the second part 68b be low, a certain amount of holes flow into the diode drift region 70 while the diode is on. Thereby, the on-resistance of the diode is reduced.

The structure and operation of the semiconductor device 100 of the present embodiment was described above. The first part 68a of the present embodiment is an example of the "specific part". The second part 68b of the present embodiment is an example of the "part other than the specific part".

Second Embodiment

Structure of Semiconductor Device 200

Figure 2:
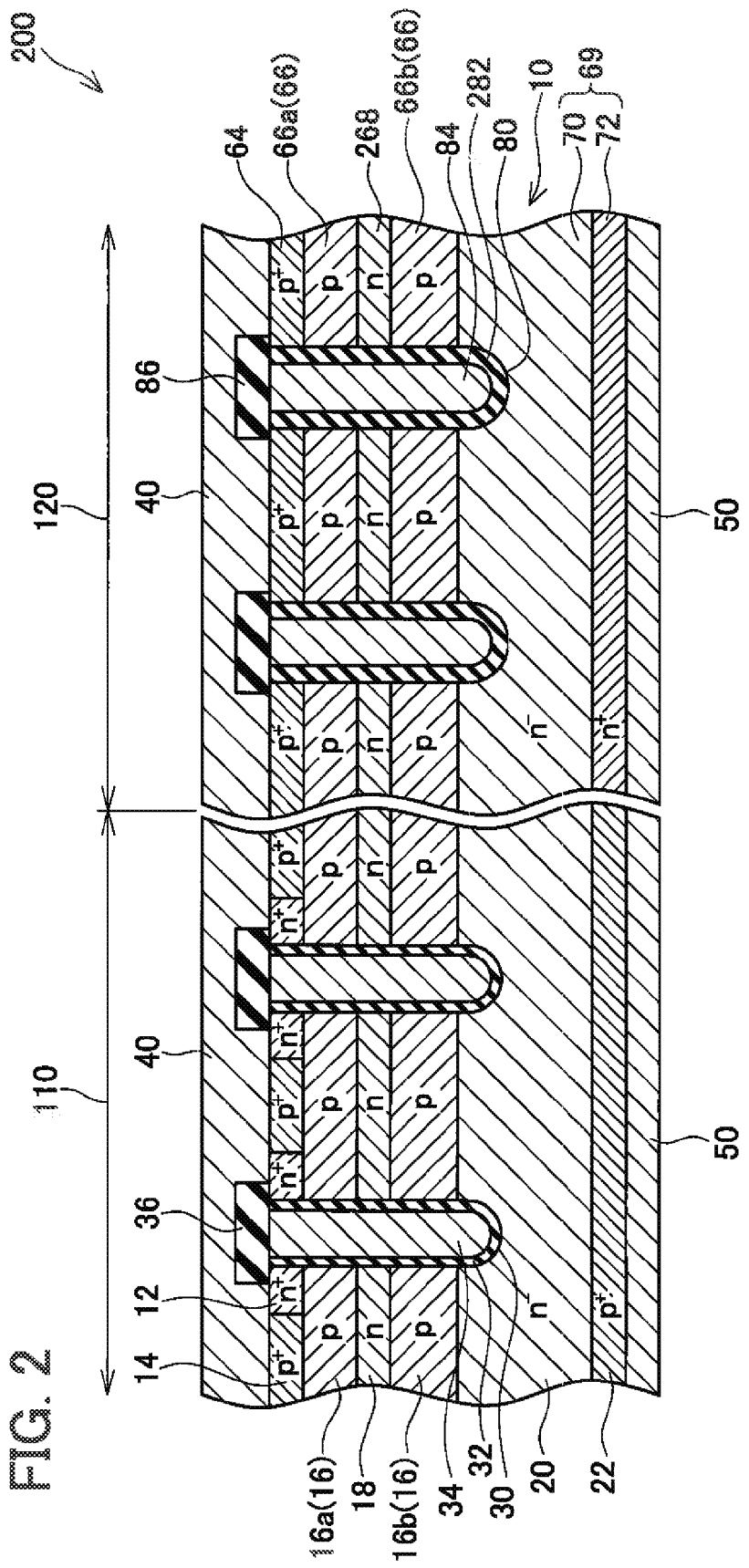
FIG. 2 shows a cross-sectional view of a semiconductor device of a second embodiment.

Next, a semiconductor device 200 of a second embodiment will be described, with reference to FIG. 2, centering on different points from the first embodiment. The basic structure of the semiconductor device 200 of the present embodiment is in common with that of the semiconductor device 100 (see FIG. 1) of the first embodiment. In FIG. 2, elements in common with the semiconductor device 100 of the first embodiment are denoted by the same reference numbers.

In the semiconductor device 200 of the present embodiment, also, a diode barrier region 268 is formed so as to be continuous with the IGBT barrier region 18 in the IGBT region 110. However, it is different from the first embodiment in that the diode barrier region 268 is formed with a single n-type impurity density in the second embodiment. In the present embodiment, the n-type impurity density of the diode barrier region 268 is equivalent to the n-type impurity density of the IGBT barrier region 18.

Furthermore, in the present embodiment, a second insulating layer 282 covering the second trench 80 differs from the first embodiment in that the second insulating layer 282 is thicker than the first insulating layer 32 covering the first trench 30. In the present embodiment, the thickness of the first insulating layer 32 is equal to or more than 50 nm and equal to or less than 200 nm, and the thickness of the second insulating layer 282 is equal to or more than 50 nm and equal to or less than 200 nm.

(Operation of Semiconductor Device 200)

The operation of the semiconductor device 200 is also basically the same as the operation of the semiconductor device 100 of the first embodiment. That is, in the present embodiment, also, when the diode is turned on, voltage (i.e., forward voltage to the diode region 120 (reverse voltage to the IGBT region 110)) to make the front surface electrode 40 plus is applied between the front surface electrode 40 and the rear surface electrode 50, and a predetermined diode ON voltage is applied to the second gate electrode 84 and the first gate electrode 34. By applying the diode ON voltage to the second gate electrode 84, a p-type channel is formed in the diode barrier region 268 in the range making contact with the second insulating layer 82, in the diode region 120. Then, electrons flow from the rear surface electrode 50 to the front surface electrode 40 via the cathode contact region 72, the diode drift region 70, the diode bottom body region 66b, the channel, the diode top body region 66a, and the anode region 64. Further, holes flow from the front surface electrode 40 to the rear surface electrode 50 via the anode region 64, the diode top body region 66a, the diode barrier region 68, the diode bottom body region 66b, the diode drift region 70, and the cathode contact region 72. Further, a portion of the holes flows toward the rear surface electrode 50 not through the diode bather region 68, but through the channel. Thereby, current flows from the front surface electrode 40 to the rear surface electrode 50.

In the present embodiment, the second insulating layer 282 making contact with the diode barrier region 268 is thicker than the first insulating layer 32. Thus, when the diode is turned on, the width of the p-type channel formed in the diode barrier region 268 is narrower than the width of the p-type channel formed in the IGBT barrier region 18. Consequently, the resistance of the p-type channel in the diode barrier region 268 is greater than the resistance of the p-type channel in the IGBT barrier region 18. Thus, since the resistance of the channel formed in the diode barrier region 268 is great, the amount of holes flowing through the channel toward the diode drift region 70 can be reduced when the diode region is turned on. It is possible to prevent the amount of holes flowing through the channel into the diode drift region 70 from becoming excessive.

On the other hand, it is not preferred that, when the diode is turned on, the amount of holes flowing into the diode drift region 70 becomes too small such that the on-resistance of the diode increases. In the semiconductor device 200 of the present embodiment, the n-type impurity density of the diode barrier region 268 is the same as the n-type impurity density of the IGBT barrier region 18. Therefore, a portion of the holes flows through a central part of the diode barrier region 268 into the diode drift region 70. Thus, it is also possible to prevent the on-resistance of the diode from becoming excessively high.

As described above, in the semiconductor device 200 of the present embodiment, by having the second insulating layer 282 be thick, a large amount of holes is prevented from flowing through the channel into the diode drift region 70 while the diode is on. Thereby, the recovery characteristics of the diode are improved. Further, by having the n-type impurity density of the diode barrier region 268 be low (i.e., be the same as the n-type impurity density of the IGBT barrier region 18), a certain amount of holes flow into the diode drift region 70 while the diode is on. Thereby, the on-resistance of the diode is reduced.

While specific examples of the present invention have been described above in detail, these examples are merely illustrative and place no limitation on the scope of the patent claims. The technology described in the patent claims also encompasses various changes and modifications to the specific examples described above. For example, the following modifications may be adopted.

(Modification 1) In the first embodiment described above, the n-type impurity density of the second part 68b of the diode barrier region 68 is lower than the n-type impurity density of the first part 68a. However, the n-type impurity density of the second part 68b is not limited to this, and may be equivalent to the n-type impurity density of the first part 68a. That is, the n-type impurity density of the diode barrier region 68 may be higher than the n-type impurity density of the IGBT barrier region 18. Thereby, since the amount of holes flowing through the IGBT barrier region 18 into the diode drift region 70 while the diode is on can be reduced, the diode recovery characteristics are improved. Generally speaking, the n-type impurity density of the specific part of the diode barrier region making contact with the second insulating layer may be higher than the n-type impurity density of the IGBT barrier region.

(Modification 2) In the embodiments described above, the IGBT barrier region 18 is formed in the IGBT body region 16 (i.e., between the IGBT top body region 16a and the IGBT bottom body region 16b). The IGBT barrier region 18 is not limited to this, and may alternatively be formed below the IGBT body region 16. In other words, the IGBT bottom body region 16b may be omitted.

(Modification 3) In the embodiments described above, an n-type semiconductor region corresponding to the emitter region 12 of the IGBT region 110 does not exist in the range exposed at the front surface of the semiconductor substrate 10 in the diode region 120. However, an n-type semiconductor region does not have to be limited to this, and may alternatively be provided in the front surface of the semiconductor substrate 10 in the diode region 120. According to such a configuration, the front surface structure of the IGBT region and the front surface structure of the diode region can be made common.

(Modification 4) That is, the feature of the second insulating layer 282 of the second embodiment may be applied to the second insulating layer 82 of the first embodiment. That is, in the first embodiment described above, the second insulating layer 82 may be formed to be thicker than the first insulating layer 32.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A semiconductor device comprising a semiconductor substrate, wherein the semiconductor substrate comprises an IGBT region and a diode region,
    the IGBT region comprises:
        an n-type emitter region exposed at a part of a front surface of the semiconductor substrate;
        a p-type IGBT body region formed at a deeper position than the emitter region;
        an n-type IGBT barrier region formed at a deeper position than the IGBT body region;
        an n-type IGBT drift region formed at a deeper position than the IGBT barrier region, having an n-type impurity density lower than that in the IGBT barrier region;
        a p-type collector region formed at a deeper position than the IGBT drift region, wherein the collector region is exposed at a rear surface of the semiconductor substrate;
        a first trench penetrating the emitter region, the IGBT body region and the IGBT barrier region, wherein a bottom part of the first trench projects into the IGBT drift region;
        a first insulating layer covering an inner surface of the first trench; and
        a first gate electrode contained in the first trench in a state where the first gate electrode is covered by the first insulating layer,
    the diode region comprises:
        a p-type diode top body region exposed at the front surface of the semiconductor substrate;
        an n-type diode barrier region formed at a deeper position than the diode top body region;
        a p-type diode bottom body region formed at a deeper position than the diode barrier region;
        an n-type cathode region formed at a deeper position than the diode bottom body region, wherein the cathode region is exposed at the rear surface of the semiconductor substrate;
        a second trench penetrating the diode top body region, the diode barrier region and the diode bottom body region, wherein a bottom part of the second trench projects into the cathode region;
        a second insulating layer covering an inner surface of the second trench; and
        a second gate electrode contained in the second trench in a state where the second gate electrode is covered by the second insulating layer, and
    an n-type impurity density of a specific part of the diode barrier region making contact with the second insulating layer is higher than an n-type impurity density of the IGBT barrier region.

2. The semiconductor device as in claim 1, wherein the n-type impurity density of the specific part is higher than an n-type impurity density of a part other than the specific part of the diode barrier region.

3. A semiconductor device comprising a semiconductor substrate, wherein the semiconductor substrate comprises an IGBT region and a diode region,
    the IGBT region comprises:
        an n-type emitter region exposed at a part of a front surface of the semiconductor substrate;
        a p-type IGBT body region formed at a deeper position than the emitter region;
        an n-type IGBT barrier region formed at a deeper position than the IGBT body region;
        an n-type IGBT drift region formed at a deeper position than the IGBT barrier region, having an n-type impurity density lower than that in the IGBT barrier region;
        a p-type collector region formed at a deeper position than the IGBT drift region, wherein the collector region is exposed at a rear surface of the semiconductor substrate;
        a first trench penetrating the emitter region, the IGBT body region and the IGBT barrier region, wherein a bottom part of the first trench projects into the IGBT drift region;
        a first insulating layer covering an inner surface of the first trench; and
        a first gate electrode contained in the first trench in a state where the first gate electrode is covered by the first insulating layer,
    the diode region comprises:
        a p-type diode top body region exposed at the front surface of the semiconductor substrate;
        an n-type diode barrier region formed at a deeper position than the diode top body region;
        a p-type diode bottom body region formed at a deeper position than the diode barrier region;
        an n-type cathode region formed at a deeper position than the diode bottom body region, wherein the cathode region is exposed at the rear surface of the semiconductor substrate;
        a second trench penetrating the diode top body region, the diode barrier region and the diode bottom body region, wherein a bottom part of the second trench projects into the cathode region;
        a second insulating layer covering an inner surface of the second trench; and
        a second gate electrode contained in the second trench in a state where the second gate electrode is covered by the second insulating layer, and
    the second insulating layer is thicker than the first insulating layer.

4. A semiconductor device comprising a semiconductor substrate, wherein the semiconductor substrate comprises an IGBT region and a diode region,
    the IGBT region comprises:
        an n-type emitter region exposed at a part of a front surface of the semiconductor substrate;
        a p-type IGBT body region formed at a deeper position than the emitter region;
        an n-type IGBT barrier region formed at a deeper position than the IGBT body region;

an n-type IGBT drift region formed at a deeper position than the IGBT barrier region, having an n-type impurity density lower than that in the IGBT barrier region;

a p-type collector region formed at a deeper position than the IGBT drift region, wherein the collector region is exposed at a rear surface of the semiconductor substrate;

a first trench penetrating the emitter region, the IGBT body region and the IGBT barrier region, wherein a bottom part of the first trench projects into the IGBT drift region;

a first insulating layer covering an inner surface of the first trench; and a first gate electrode contained in the first trench in a state where the first gate electrode is covered by the first insulating layer, the diode region comprises:

a p-type diode top body region exposed at the front surface of the semiconductor substrate;

an n-type diode barrier region formed at a deeper position than the diode top body region;

a p-type diode bottom body region formed at a deeper position than the diode barrier region;

an n-type cathode region formed at a deeper position than the diode bottom body region, wherein the cathode region is exposed at the rear surface of the semiconductor substrate;

a second trench penetrating the diode top body region, the diode barrier region and the diode bottom body region, wherein a bottom part of the second trench projects into the cathode region;

a second insulating layer covering an inner surface of the second trench; and a second gate electrode contained in the second trench in a state where the second gate electrode is covered by the second insulating layer, and a resistance of a channel formed in the diode bather region is higher than a resistance of a channel formed in the IGBT bather region.

\* \* \* \* \*